(12) United States Patent
Ishii

(10) Patent No.: US 11,475,940 B2
(45) Date of Patent: Oct. 18, 2022

(54) SEMICONDUCTOR DEVICE LAYOUT FOR A PLURALITY OF PADS AND A PLURALITY OF DATA QUEUE CIRCUITS

(71) Applicant: Micron Technology, Inc., Boise, ID (US)

(72) Inventor: Toshinao Ishii, Machida (JP)

(73) Assignee: Micron Technology, Inc., Boise, ID (US)

( * ) Notice: Subject to any disclaimer, the term of this patent is extended or adjusted under 35 U.S.C. 154(b) by 20 days.

(21) Appl. No.: 17/119,483

(22) Filed: Dec. 11, 2020

(65) Prior Publication Data

US 2022/0189530 A1   Jun. 16, 2022

(51) Int. Cl.
*G11C 11/4096*   (2006.01)
*G11C 11/4093*   (2006.01)
*G11C 11/4078*   (2006.01)

(52) U.S. Cl.
CPC ...... *G11C 11/4096* (2013.01); *G11C 11/4078* (2013.01); *G11C 11/4093* (2013.01)

(58) Field of Classification Search
CPC ............ G11C 11/4096; G11C 11/4078; G11C 11/4093
USPC ....................................................... 365/149
See application file for complete search history.

(56) References Cited

U.S. PATENT DOCUMENTS

| | | | | |
|---|---|---|---|---|
| 5,793,588 A * | 8/1998 | Jeong | ........................ | H02H 9/00 361/56 |
| 5,917,438 A * | 6/1999 | Ando | ........................ | H03M 7/34 341/51 |
| 2004/0145042 A1 | 7/2004 | Morita et al. | | |
| 2004/0196682 A1 | 10/2004 | Funaba et al. | | |
| 2004/0264260 A1 * | 12/2004 | Kono | ........................ | G11C 5/00 365/189.07 |
| 2009/0003026 A1 * | 1/2009 | Riho et al. | ........................ | G11C 5/02 365/51 |
| 2011/0063925 A1 | 3/2011 | Mizukane et al. | | |
| 2017/0301388 A1 | 10/2017 | Lee et al. | | |
| 2018/0060265 A1 | 3/2018 | Ito et al. | | |
| 2018/0130739 A1 * | 5/2018 | Miura et al. | ........................ | H01L 23/5226 |

OTHER PUBLICATIONS

PCT Application No. PCT/US21/62791 titled "Terminals and Data Input/Output Circuits Layout" filed Dec. 10, 2021.
"International Search Report and Written Opinion for PCT/US2021/062791, dated Mar. 25, 2022".

* cited by examiner

*Primary Examiner* — Connie C Yoha
(74) *Attorney, Agent, or Firm* — Dorsey & Whitney LLP

(57) ABSTRACT

Apparatuses for providing pads included in external terminals of a semiconductor device are described. An example apparatus includes a memory cell array, a data queue (DQ) circuit, a data pad and a power pad. The memory cell array may include one or more memory cells. In a write operation, the data pad receives write data and provides the write data to the DQ circuit. The DQ circuit receives the write data and provides the write data to the memory cell array. In a read operation, the DQ circuit receives read data from the memory cell array and provides the read data. The data pad receives the read data from the DQ circuit and provides the read data. The power pad provides a power supply voltage. The data pad and the power pad are disposed across from each other with respect to the DQ circuit.

20 Claims, 4 Drawing Sheets

SEMICONDUCTOR DEVICE LAYOUT FOR A PLURALITY OF PADS AND A PLURALITY OF DATA QUEUE CIRCUITS

BACKGROUND

High data reliability, high speed of memory access, reduced chip size and reduced power consumption are features that are demanded from semiconductor memory.

In conventional peripheral circuitries for a semiconductor device, for example, pads and data queue circuits (or data input/output circuits) are arranged in a corresponding manner across layers. The data queue circuit or data input/output circuit is called collectively "DQ circuit" hereinafter. Each pad, which is configured to be coupled to an external circuitry outside the semiconductor device, is located in proximity to (e.g., immediately above) its respective DQ circuit in order to keep wirings between the pads and the DQ circuits the same length that is sufficiently short to have the same low impedance. In recent years, there has been an effort to reduce an area of a peripheral circuit region that is occupied by peripheral circuitries included on a semiconductor die of a memory device. For example, a size of each DQ circuit has become even smaller in order to improve driving ability for faster operations by shorter wirings (e.g., a clock signal line CLK, which provides a clock signal to the DQ circuits). However, there is a limit in reducing an area of the pads.

DETAILED DESCRIPTION OF PREFERRED EMBODIMENTS

Various embodiments of the disclosure will be explained below in detail with reference to the accompanying drawings. The following detailed description refers to the accompanying drawings that show, by way of illustration, specific aspects and details in which embodiments of the disclosure may be practiced. The detailed description includes sufficient detail to enable those skilled in the art to practice embodiments of the disclosure. Other embodiments may be utilized, and structure, logical and electrical changes may be made without departing from the scope of the present disclosure. The various embodiments disclosed herein are not necessary mutually exclusive, as some disclosed embodiments can be combined with one or more other disclosed embodiments to form new embodiments.

As previously described, a size of each DQ circuit has become even smaller, and continuing to reduce a size of each pad is challenging. Due to the size difference between pads and DQ circuits, control signal lines between the DQ circuits as well as conductors between the DQ circuits and the pads are relatively longer. The longer wirings tend to result in higher power consumption due to each wiring's inherent impedance according to its length.

Figure 1:
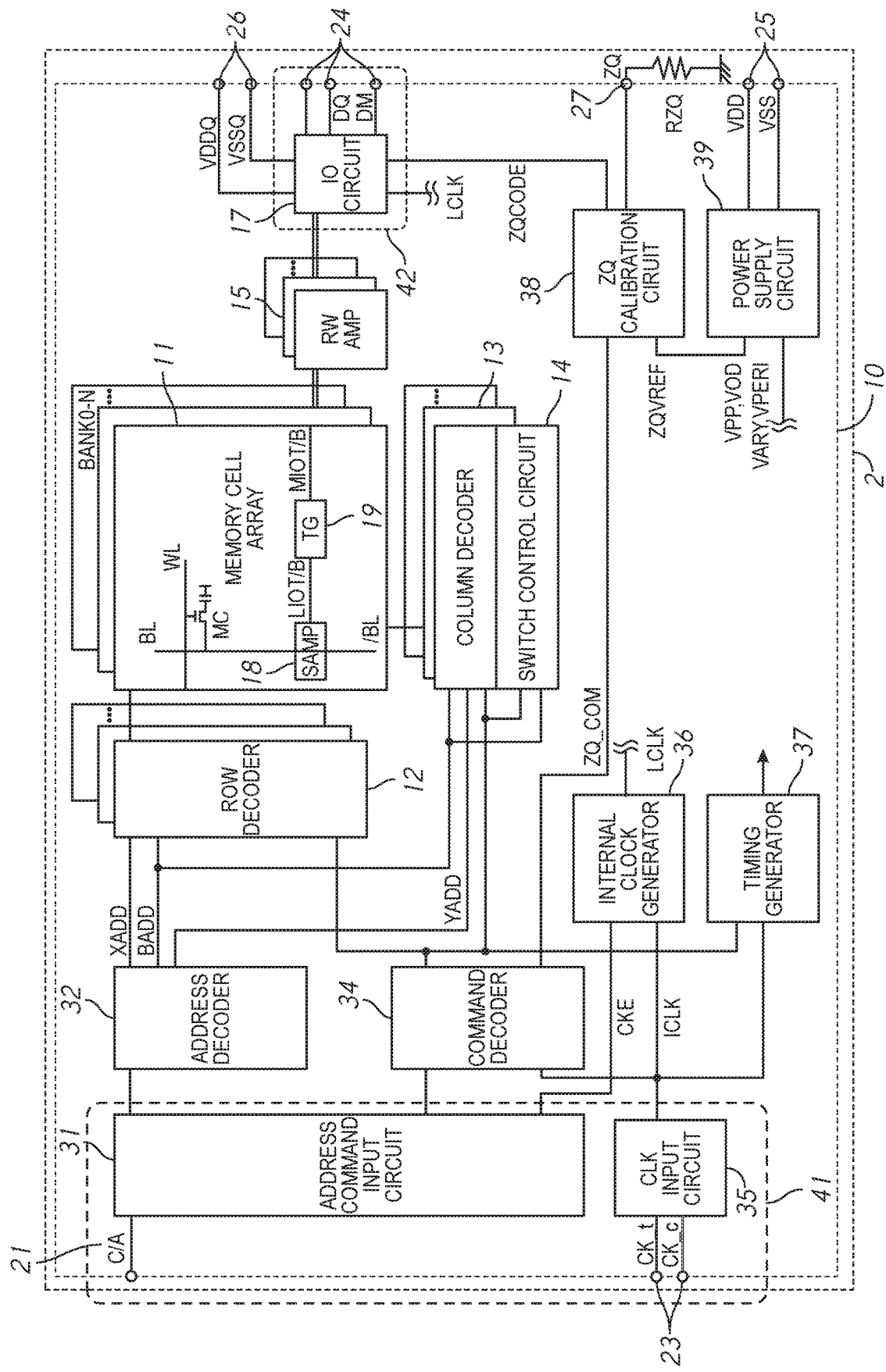
FIG. 1 is a block diagram of a semiconductor device in accordance with the present disclosure.

FIG. 1 is a block diagram of a semiconductor device 10 in accordance with one embodiment of the present disclosure. The semiconductor device 10 may be a double data rate SDRAM integrated into a single semiconductor chip, for example. The semiconductor device 10 may be mounted on an external substrate 2, for example, a memory module substrate, a mother board or the like. The external substrate 2 may include an external resistor $R_{ZQ}$ that is connected to a calibration terminal ZQ 27 of the semiconductor device 10. The external resistor $R_{ZQ}$ is a reference impedance of a ZQ calibration circuit 38. In the present embodiment, the external resistor $R_{ZQ}$ is coupled to a ground potential. In other embodiments, however, the external resistor $R_{ZQ}$ may be coupled to a different potential.

As shown in FIG. 1, the semiconductor device 10 includes a memory cell array 11. The memory cell array 11 includes a plurality of banks, each bank including a plurality of word lines WL, a plurality of bit lines BL, and a plurality of memory cells MC arranged at intersections of the plurality of word lines WL and the plurality of bit lines BL. The selection of the word line WL is performed by a row decoder 12 and the selection of the bit line BL is performed by a column decoder 13. Sense amplifiers 18 are coupled to corresponding bit lines BL and connected to local I/O line pairs LIOT/B. Local IO line pairs LIOT/B are connected to main IO line pairs MIOT/B via transfer gates TG 19 which function as switches.

Turning to the explanation of a plurality of external terminals included in the semiconductor device 10, the plurality of external terminals includes command/address terminals 21, clock terminals 23, data terminals 24, power supply terminals 25 and 26, and the calibration terminal ZQ 27. An input signal block 41 may include the command/address terminals 21. The command/address terminals 21 and signal lines coupled to the command/address terminal 21 may include a first set of terminals and signal lines that are configured to receive the command signals and a separate, second set of terminals and signal lines that configured to receive the address signals, in some examples. In other examples, the terminals 21 and signal lines associated with command/address terminals 21 the may include common terminals and signal lines that are configured to receive both command signal and address signals. The input signal block 41 may include the clock terminals 23 which include input buffers. A data interface block 42 includes the data terminals 24 that will be later described, according to one embodiment. The data terminals 24 may be coupled to output buffers for read operations of memories. Alternatively, the data terminals 24 may be coupled to input buffers for read/write access of the memories. FIG. 1 shows an example of dynamic random access memory (DRAM), however, any device having external terminals for signal input/output may be included as the external terminals of embodiments of the present disclosure. Each terminal of the plurality of external terminals may include a pad. A plurality of pads in the plurality of external terminals 24 will be explained below in detail.

The semiconductor device 10 includes an address/command input circuit 31. The address/command input circuit 31 may receive an address signal ADD and a bank address signal BADD from the command/address terminals 21, and transmit the address signal ADD and the bank address signal BADD to an address decoder 32. The address decoder 32 may decode the address signal ADD and provide a decoded row address signal XADD to the row decoder 12, and a decoded column address signal YADD to the column decoder 13. The address decoder 32 also may also receive the bank address signal BADD and provide the bank address signal BADD to the row decoder 12 the column decoder 13, and a switch control circuit 14.

The address/command input circuit 31 may receive a command signal from outside, such as, for example, a memory controller, at the command/address terminals 21. The address/command input circuit 21 may provide the command signal to the command decoder 34. The command decoder 34 may decode the command signal and generate various internal command signals. The internal command signals may be used to control operation and timing of various circuits of the semiconductor device 10. For example, the internal command signals may include a row command signal, such as an active command, to select a word line and a column command signal, such as a read command or a write command, to select a bit line, and a calibration signal ZQC provided to the ZQ calibration circuit 38.

Accordingly, when an active command is issued with a row address and a column address is timely supplied with a read command, read data is read from a memory cell MC in the memory cell array 11 designated by these row address and column address. The read data DQ is output externally from the data terminals 24 via a read/write amplifier 15 and an input/output circuit 17. Similarly, when the write command is issued and a row address and a column address are timely supplied with this command, and then write data DQ is supplied to the data terminals 24, the write data DQ is supplied via the input/output circuit 17 and the read/write amplifier 15 to the memory cell array 11 and written in the memory cell MC designated by the row address and the column address.

The clock terminals 23 are supplied with external clock signals CK_t and CK_c, respectively. These external clock signals CK_t and CK_c are complementary to each other and are supplied to a clock input circuit 35. The clock input circuit 35 receives the external clock signals CK_t and CK_c and generates an internal clock signal ICLK. The internal clock signal ICLK is supplied to an internal clock generator 36 and thus a phase controlled internal clock signal LCLK is generated based on the received internal clock signal ICLK and a clock enable signal CKE from the command input circuit 33. Although not limited thereto, a DLL circuit can be used as the internal clock generator 36. The phase controlled internal clock signal LCLK is supplied to the input/output circuit 17 and is used as a timing signal for determining an output timing of the read data DQ. The internal clock signal ICLK is also supplied to a timing generator 37 and thus various internal clock signals can be generated.

The power supply terminals 25 are supplied with power supply potentials VDD and VSS. These power supply potentials VDD and VSS are supplied to an internal power supply circuit 39. The internal power supply circuit 39 generates various internal potentials VPP, VOD, VARY, VPERI, and the like and a reference potential ZQVREF based on the power supply potentials VDD and VSS. The internal potential VPP is mainly used in the row decoder 12, the internal potentials VOD and VARY are mainly used in the sense amplifiers 18 included in the memory cell array 11, and the internal potential VPERI is used in many other circuit blocks. The reference potential ZQVREF is used in the ZQ calibration circuit 38.

The power supply terminals 26 are supplied with power supply potentials VDDQ and VSSQ. These power supply potentials VDDQ and VSSQ are supplied to the input/output circuit 17. The power supply potentials VDDQ and VSSQ may be the same potentials as the power supply potentials VDD and VSS that are supplied to the power supply terminals 25, respectively. However, the power supply potentials VDDQ and VSSQ may be used for the input/output circuit 17 so that power supply noise generated by the input/output circuit 17 does not propagate to the other circuit blocks.

The calibration terminal ZQ is connected to the calibration circuit 38. The calibration circuit 38 performs a calibration operation with reference to an impedance of an external resistance Re and the reference potential ZQVREF, when activated by the calibration signal ZQ_COM. An impedance code ZQCODE obtained by the calibration operation is supplied to the input/output circuit 17, and thus an impedance of an output buffer (not shown) included in the input/output circuit 17 is specified.

Figure 2:
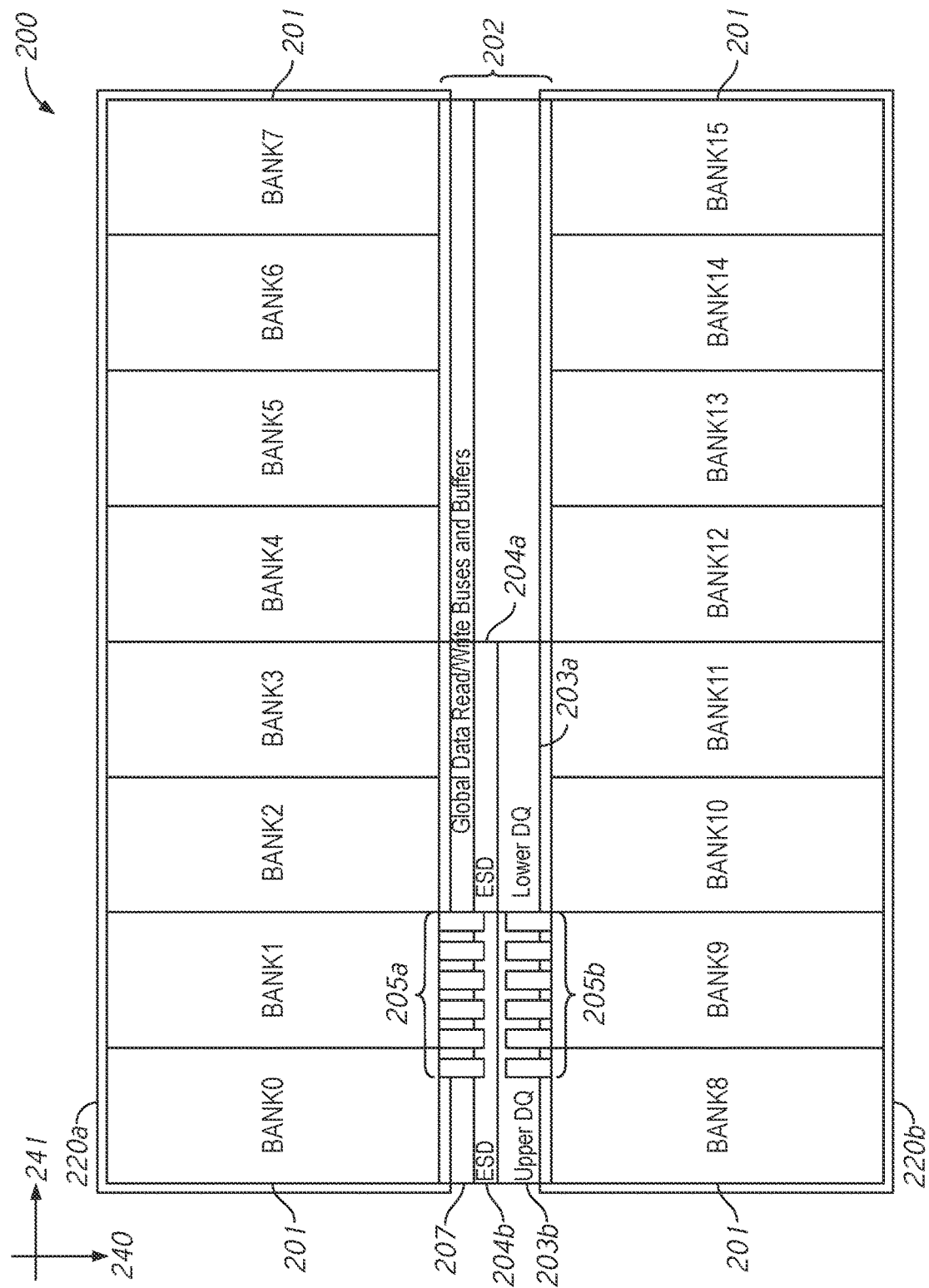
FIG. 2 is a layout diagram of the semiconductor device in accordance with an embodiment of the present disclosure.

FIG. 2 is a layout diagram of a semiconductor device 200 in accordance with an embodiment of the present disclosure. FIG. 2 may be a plan view of a layout of the semiconductor device 200, including circuits and array areas. The semiconductor device 200 may be the semiconductor device 10 of FIG. 1 in some embodiments of the disclosure. The semiconductor device 200 may be a memory die, such as a DRAM die. The semiconductor device 200 may include two regions 220a and 220b, and further include a center region 202 aligned with regions 220a and 220b in a direction 240. The center region 202 is disposed between the regions 220a and 220b. The semiconductor device 200 may include a plurality of banks 201 (e.g., BANKS 0-15). The plurality of banks 201 may be included in the plurality of banks 0-N of the memory cell array 11 of FIG. 1. A portion of the plurality of banks 201 (e.g., BANKS 0-7) may be disposed in the first region 220a. The portion of the plurality of banks 201 (e.g., BANKS 0-7) may be aligned in a direction 241 that is substantially perpendicular to the direction 240. Another portion of the plurality of banks 201 (e.g., BANKS 8-15) may be disposed in the second region 220b. The other portion of the plurality of banks 201 (e.g., BANKS 8-15) may be aligned in the direction 241.

The semiconductor device 200 includes a plurality of pads 205a and 205b. The plurality of pads 205a and 205b may be, for example, the plurality of pads included in the plurality of external terminals of FIG. 1. As shown in FIG. 2, the plurality of pads 205a may be aligned in the direction 241 and the plurality of pads 205b may be aligned in the direction 241. The plurality of pads 205a and the other plurality of pads 205b may be disposed across from each other in the direction 240 with respect to the plurality of DQ circuits 203a and 203b.

The semiconductor device 200 may further include a first plurality of data queue (DQ) circuits 203a and a second plurality of DQ circuits 203b disposed in the center region 202. The first plurality of data queue (DQ) circuits 203a and a second plurality of DQ circuits 203b may be, for example, in the I/O circuit 17. The first plurality of DQ circuits 203a may receive and transmit lower bits of data and the second plurality of DQ circuits 203b may receive and transmit upper bits of data. The first plurality of DQ circuits 203a and the second plurality of DQ circuits 203b may further include electrostatic discharge (ESD) protection circuits 204a and 204b respectively. The ESD protection circuits 204a and 204b may protect the first and second plurality of DQ circuits 203a and 203b from failures due to electrostatic discharges typically transmitted by way of a plurality of respective pads 205a and 205b. For example, when an electrostatic discharge is present at the plurality of respective pads 205a and 205b, the ESD protection circuits 204a and 204b may activate and provide a conductive path to safely discharge the electrostatic discharge and prevent damage to the first and second plurality of DQ circuits 203a and 203b. Data may be transmitted between the first and second plurality of pads 205a and 205b the first and second plurality of DQ circuits 203a and 203b, respectively. The data may include read data transmitted from the first plurality of DQ circuits 203a and the second plurality of DQ circuits 203b to the plurality of pads 205a and 205b. The data may include write data transmitted to the first plurality of DQ circuits 203a and the second plurality of DQ circuits 203b from the plurality of pads 205a and 205b. The semiconductor device 200 may include a global read/write data busses and buffers (global RWDB) 207 disposed in the center region 202. The global RWDB 207 may be included in the semiconductor device 10 in some embodiments of the disclosure. For example, the global RWDB 207 may be disposed between the input/output circuit 17 and the read/write amplifier 15. In some embodiments of the disclosure, the plurality of DQ circuits 203a and 203b, the ESD protection circuits 204a and 204b, and the global RWDB 207 may be disposed, for example, on a base layer, and the plurality of pads 205a and 205b may be on a layer different from the base layer.

Figure 3:
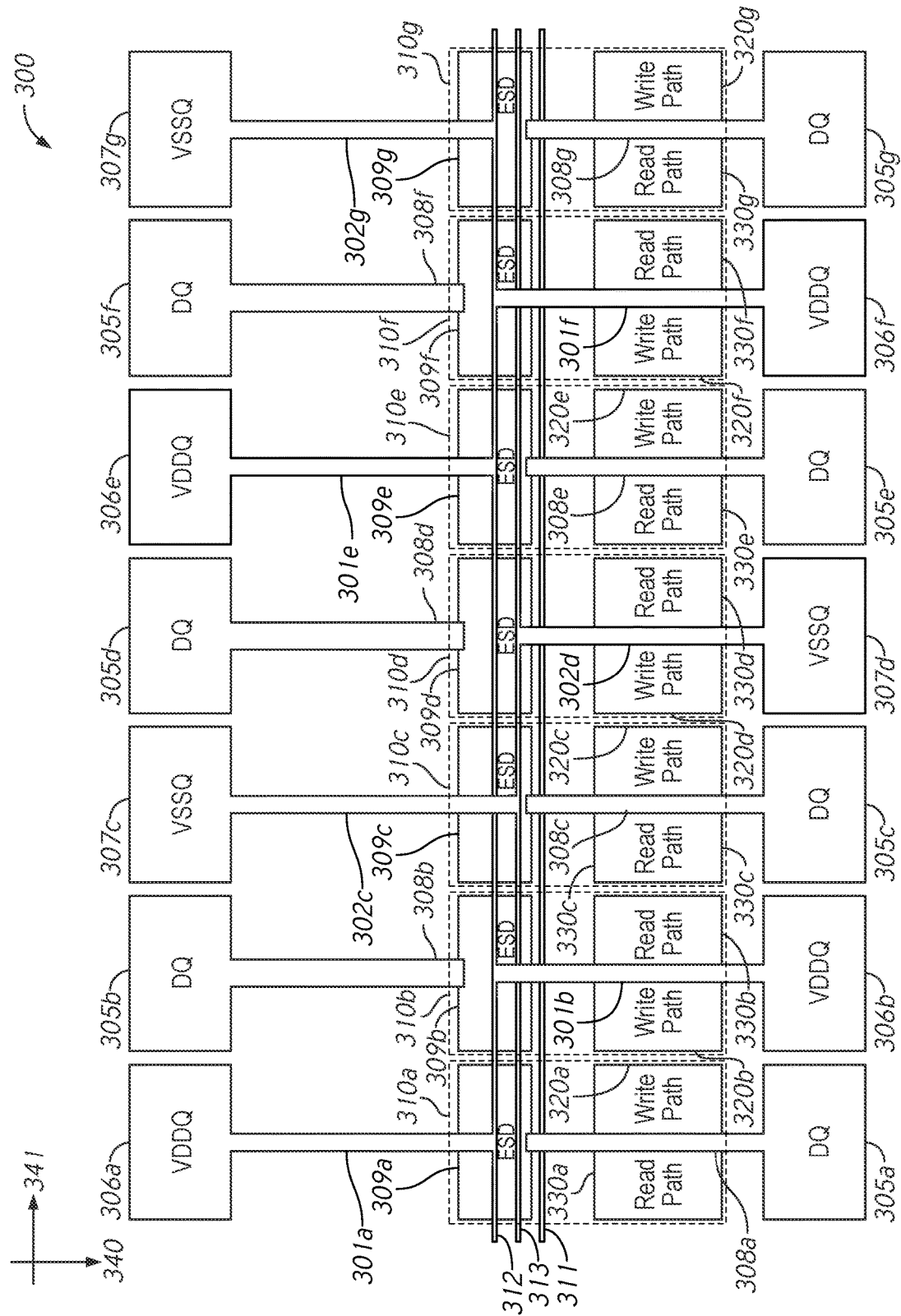
FIG. 3 is a layout diagram including a plurality of DQ circuits and a plurality of pads in accordance with one embodiment of the present disclosure.

FIG. 3 is a layout diagram including a plurality of DQ circuits 310a-g and a plurality of pads 305a-g, 306a, b, e, f, and 307c, d, g, in accordance with one embodiment of the present disclosure. FIG. 3 may be a plan view of a layout of the plurality of DQ circuits 310a-g and the plurality of pads 305a-g, 306a, b, e, f, and 307c, d, g. The plurality of DQ circuits 310a-g may be a portion of either the first plurality of data queue (DQ) circuits 203a or the second plurality of DQ circuits 203b in FIG. 2. The plurality of pads 305a-g, may be, for example, data pads in the data terminals 24 of FIG. 1. The pads 305a-g are data pads that may receive and provide data signal. The pads 306a, b, e, f and the pads 307c, d, g may be power pads included in a power supply terminal VDDQ/VSSQ 26 in FIG. 1. The pads 306a, b, e, f are power pads that may provide a power supply voltage (e.g., VDDQ) to a power line 312 through conductors 301a, b, e, f, and the pads 307c, d, g are power pads that may provide another power supply voltage (e.g., VSSQ) to a power line 313 through conductors 302c, d, g. As shown in FIG. 3, the plurality of pads 306a, 305b, 307c, 305d, 306e, 305f and 307g may be aligned in a direction 341, and the plurality of pads 305a, 306b, 305c, 307d, 305e, 306f and 305g may be aligned in the direction 341. Each data pad of the data pads are disposed between two power pads, and are adjacent to the data pad in the direction 341, where the two power pads may provide two different power supply voltages (e.g., VDDQ and VSSQ). The pads 305a, 305c, 305e and 305g coupled to the DQ circuits 310a, 310c, 310e and 310g are arranged at one side (e.g., a bottom side) of the DQ circuits 310a, 310c, 310e and 310g respectively. The pads 305b, 305d and 305f coupled to the DQ circuits 310b, 310d and 310f are arranged at an opposite side (e.g., a top side) of the DQ circuits 310b, 310d and 310f.

Each data pad and one of the power pads may be disposed across from each other with respect to the DQ circuit in a direction 340. The direction 340 is substantially perpendicular to the direction 341. For example, the pads 306a and 305a may be disposed across from each other in the direction 340 with respect to the DQ circuit 310a. The pads 305b and 306b may be disposed across from each other in the direction 340 with respect to the DQ circuit 310b. The pads 307c and 305c may be disposed across from each other in the direction 340 with respect to the DQ circuit 310c. The pads 305d and 307d may be disposed across from each other in the direction 340 with respect to the DQ circuit 310d. The pads 306e and 305e may be disposed across from each other in the direction 340 with respect to the DQ circuit 310e. The pads 305f and 306f may be disposed across from each other in the direction 340 with respect to the DQ circuit 310f. The pads 307g and 305g may be disposed across from each other in the direction 340 with respect to the DQ circuit 310g.

Each DQ circuit of the plurality of DQ circuits 310a-g may include an ESD protection circuit, a write path block and a read path block. The write path block and the read path block in each DQ circuit may be adjacent to each other in the direction 341. Adjacent DQ circuits of the DQ circuits 310a-g may include the read path block and the write path block in different orders in the direction 341. For example, the DQ circuit 310a may include a read path block 330a and a write path block 320a, where the write path block 320a is adjacent to the DQ circuit 310b. The DQ circuit 310b may include a write path block 320b adjacent to the write path block 320a of the DQ circuit 310a. The DQ circuit 310b may also include a read path block 330b that is adjacent to the DQ circuit 310c. The DQ circuit 310c may include a read path block 330c that is adjacent to the read path block 330b, and include a write path block 320c that is adjacent to the DQ circuit 310d. The DQ circuit 310d may include a write path block 320d adjacent to the write path block 320c of the DQ circuit 310c. The DQ circuit 310d may also include a read path block 330d that is adjacent to the DQ circuit 310e. The DQ circuit 310e may include a read path block 330e that is adjacent to the read path block 330d, and include a write path block 320e that is adjacent to the DQ circuit 310f. The DQ circuit 310f may include a write path block 320f adjacent to the write path block 320e of the DQ circuit 310e. The DQ circuit 310f may also include a read path block 330f that is adjacent to the DQ circuit 310g. The DQ circuit 310g may include a write path block 320e, and include a read path block 330g that is adjacent to the read path block 330. In FIG. 3, either two read path blocks or two write path blocks in two adjacent DQ circuits of the plurality of DQ circuits 310a-g may be adjacent to each other. However, any circuit layout arrangement including a mirror layout in which two identical circuit components in two DQ circuits are disposed in a symmetrical manner with respect to a line extending in the direction 340 between the two adjacent DQ circuits may be desired. By having the mirror layout, a difference in impedances from the read paths or the write paths of the DQ circuits 310a-g with respects to power lines 312 and 313 providing power supply voltages VDDQ and VSSQ may be balanced within a predetermined range that is acceptable for operations.

Each electrostatic discharge (ESD) protection circuit of the ESD protection circuits 309a-g may be disposed in the respective DQ circuits in the direction 340 from the read path block and the write path block of each respective DQ circuit. The ESD protection circuits 309a-g may be a portion of the ESD protection circuits 204a and 204b in FIG. 2 in some embodiments. The ESD protection circuits 309a-g may be coupled to the data pads 305a-305g to protect the DQ circuits 310a to 310g, respectively. Conductors 308a-g may couple the data pads 305a-g to the ESD protection circuits 309a-g and may further couple the data pads 305a-g to the read path blocks 330a-g and the write path blocks 320a-g, respectively.

In some embodiments, each data pad and one of the power pads may be disposed in the direction 340 in a symmetrical manner with respect to the ESD protection circuit. For example, the pads 306a and 305a may be disposed across from each other in the direction 340 with respect to the ESD protection circuit 309a. The pads 305b and 306b may be disposed across from each other in the direction 340 with respect to the ESD protection circuit 309b. The pads 307c and 305c may be disposed across from each other in the direction 340 with respect to ESD protection circuit 309c. The pads 305d and 307d may be disposed across from each other in the direction 340 with respect to the ESD protection circuit 309d. The pads 306e and 305e may be disposed across from each other in the direction 340 with respect to the ESD protection circuit 309e. The pads 305f and 306f may be disposed across from each other in the direction 340 with respect to the ESD protection circuit 309f. The pads 307g and 305g may be disposed across from each other in the direction 340 with respect to the ESD protection circuit 309g.

The circuits, conductors, and pads may be formed from different layers of a semiconductor structure. For example, the data pads 305a-g and the ESD protection circuits 309a-g may be formed on different layers. In another example, the ESD protection circuits 309a-g and the DQ circuits 310a-g may be disposed on a base layer of a semiconductor structure. The conductors 308a-g may be included in one or more layers between the base layer and a layer in which the data pads 305a-g are disposed. The data pads 305a-g may be disposed above the layer including the conductors 308a-308g. Some conductors, such as the conductors 308a, 308c, 308e and 308g, may cross over the DQ circuits 310a, 310c, 310e, and 310g to couple the data pads 305a, 305c, 305e and 305g to the DQ circuits 310a, 310c, 310e, and 310g, including the ESD protection circuits 309a, 309c, 309e and 309g, respectively. Some conductors, such as the conductors 308b, 308d and 308f may couple the data pads 305b, 305d and 305f to the DQ circuits 310b, 310d and 310f including the ESD protection circuits 309b, 309d and 309f respectively, without crossing over the DQ circuits 310b, 310d and 310f. Data may be communicated between the data pads 305a-g and the ESD protection circuits 309a-g through the conductors 308a-g respectively. In some embodiments, the conductors 308a-g may have the same width, length and thickness, to obtain a substantially similar impedance between the data pad and the ESD protection circuit. Thus, the distance between each data pad and each ESD protection circuit coupled to each data pad may be substantial the same across the data pads 305a-g and the ESD protection circuits 309a-g, respectively. In some embodiments of the disclosure, the conductors 308a-g may be conductors including a distribution conductive layer (e.g., an inline redistribution layer iRDL). The ESD protection circuits 309a-g may protect the DQ circuits 310a-g from failures due to electrostatic discharges from the data pads 305a-g. A set of signal lines 311 may be disposed to pass through the DQ circuits 310a-g. The set of signal lines may include, for example, clock signal lines and control signal lines used by the DQ circuits 310a-g.

Figure 4:
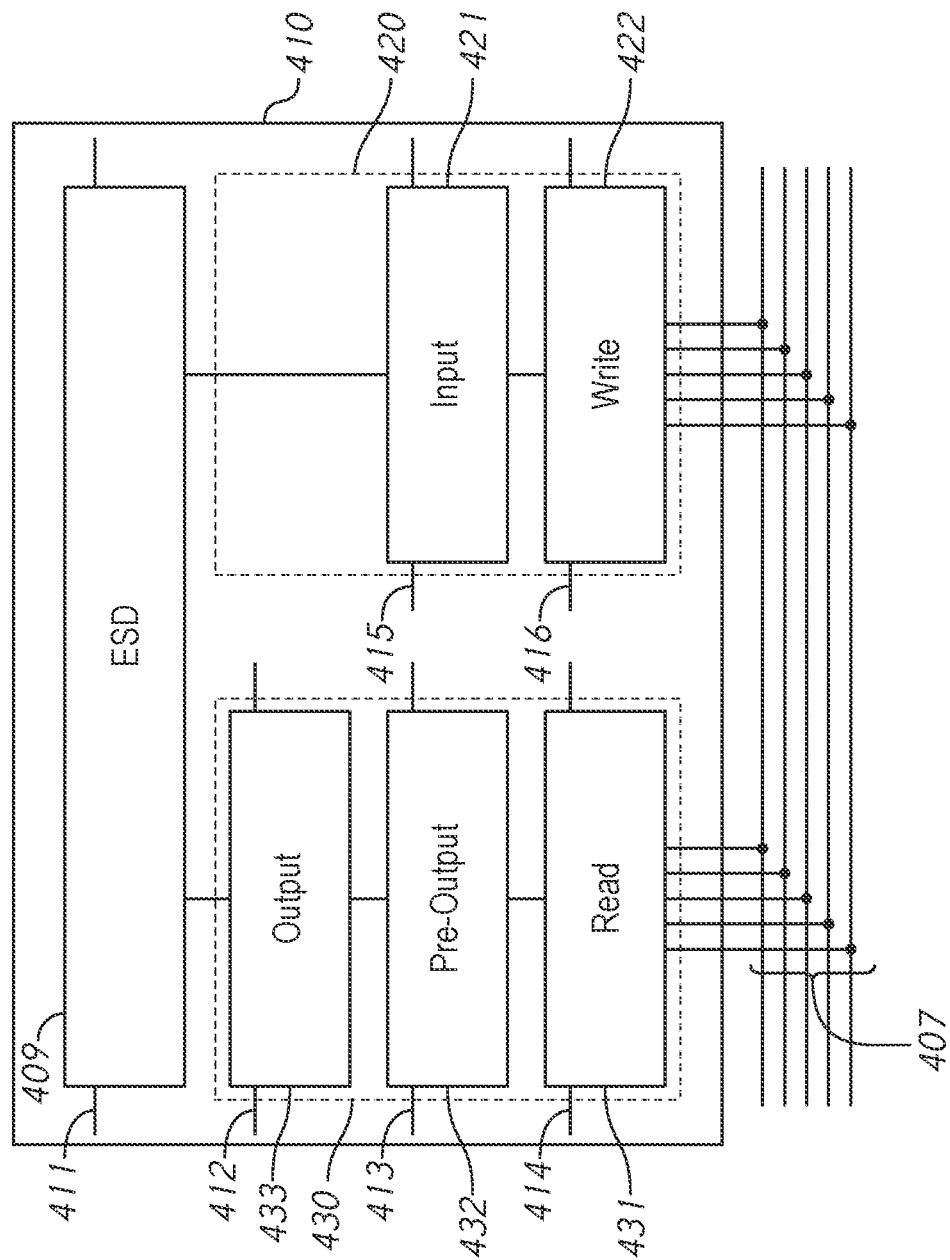
FIG. 4 is a block diagram of a DQ circuit in accordance with the present disclosure.

FIG. 4 is a block diagram of a DQ circuit 410 in accordance with the present disclosure. The DQ circuit 410 may be one of the DQ circuits 310a-g in FIG. 3 in some embodiments. The DQ circuit 410 may be formed on a base layer.

The DQ circuit 410 may include an ESD protection circuit 409. The ESD protection circuit 409 may be one of the ESD protection circuits 309a-g in FIG. 3 in some embodiments. The ESD protection circuit 409 may be disposed adjacent to a write path block 420 and a read path block 430 of the DQ circuit 410. The ESD protection circuits 409 may receive an electrostatic discharge from a corresponding data pad (not shown) and protect to the DQ circuit 410 from failures due to electrostatic discharges. A set of signal lines 411 may be coupled to the ESD protection circuit 409. The set of signal lines may include, for example, clock signal lines and control signal lines used by the ESD protection circuit 409.

The DQ circuit 410 may include the write path block 420 and the read path block 430. The write path block 420 may include an input circuit 421 and a write circuit 422. The input circuit 421 may include, for example, an input buffer. The input circuit 421 may receive write data from a corresponding data pad (not shown). In some embodiments, the write data from the corresponding data pad may be first received at the ESD protection circuit 409 and then transmitted to the input circuit 421. The input circuit 421 may also receive a reference voltage and a data strobe clock signal from a set of signal lines 415. Responsive to the data strobe clock signal, the input circuit 421 may latch the data using the reference voltage to determine a value of the write data (e.g., a logic high level or a logic low level). The input circuit 421 may further adjust a timing to provide the write data to the write circuit 422, then provide the data to the write circuit 422. The write circuit 422 may convert the write data provided in a serial format (e.g., in time sequence) into the write data in a plurality of bits in parallel. The write circuit 422 may provide the write data to a memory cell array through global read/write data busses and buffers (global RWDB) 407, responsive to an internal clock signal (e.g., a write clock signal based on a phase controlled internal clock signal LCLK) from an internal clock signal line 416. The memory cell array may be one of the memory cell arrays 11 in FIG. 1. The global read/write data busses and buffers (global RWDB) 407 may be the global read/write data busses and buffers (global RWDB) 207 in FIG. 2.

The read path block 430 may include a read circuit 431, a pre-output circuit 432 and an output circuit 433. The read circuit 431 may receive read data from a plurality of memory cells in the memory cell array through the global read/write data busses and buffers (global RWDB) 407, and store the read data. The read circuit 431 may convert the read data received in parallel into the data in the serial format, and provide the read data in the serial format (in time sequence) using another internal clock signal (e.g., a read clock signal based on the phase controlled internal clock signal LCLK) from another internal clock signal line, 414. The pre-output circuit 432 may be coupled to the read circuit 431. The pre-output circuit 432 may adjust a slew rate of an output buffer in the output circuit 433, based on, at least in part, a calibration signal ZQ (e.g., via the calibration terminal ZQ 27 in FIG. 1) from a calibration signal line 413. The output circuit 433 may be coupled to the pre-output circuit 432. The output circuit 433 may include the output buffer that may provide the read data in the serial format to the corresponding pad (not shown). In some embodiments, the read data may be transmitted to the corresponding pad (not shown) by way of the ESD protection circuit 411.

Although various embodiments have been disclosed in the present disclosure, it will be understood by those skilled in the art that the scope of the disclosure extends beyond the specifically disclosed embodiments to other alternative embodiments and/or uses and obvious modifications and equivalents thereof. In addition, other modifications which are within the scope of this disclosure will be readily apparent to those of skill in the art based on this disclosure. It is also contemplated that various combination or sub-combination of the specific features and aspects of the embodiments may be made and still fall within the scope of the disclosure. It should be understood that various features and aspects of the disclosed embodiments can be combined with or substituted for one another in order to form varying embodiments. Thus, it is intended that the scope of at least some of the present disclosure should not be limited by the particular disclosed embodiments described above.

What is claimed is:

1. An apparatus comprising:
a memory cell array including a plurality of memory regions;
a plurality of data pads including a first set of data pads and a second set of data pads; and
a plurality of data queue (DQ) circuits including a first set of DQ circuits and a second set of DQ circuits alternatingly arranged in a direction, each DQ circuit coupled between a corresponding data pad of the plurality of data pads and a corresponding memory region of the plurality of memory regions of the memory cell array,
wherein the first set of data pads coupled to the corresponding first set of DQ circuits are arranged at a side of the plurality of DQ circuits, and a second set of DQ pads coupled to the corresponding second set of DQ circuits are arranged at an opposite side of the plurality of DQ circuits.

2. The apparatus of claim 1, wherein the first set of DQ circuits includes a first DQ circuit, and the second set of DQ circuits includes a second DQ circuit adjacent to the first DQ circuit in the direction,
wherein the first DQ circuit includes a first circuit component and the second DQ circuit includes a second circuit component, and
wherein the first and second circuit components are identical.

3. The apparatus of claim 2, wherein the first and second circuit components are disposed in a symmetrical manner with respect to a border between the first and second DQ circuits.

4. The apparatus of claim 3, where each DQ circuit of the first and second DQ circuits comprises a first path block and a second path block, and
wherein the second path blocks of the first and second DQ circuits are adjacent to each other.

5. The apparatus of claim 4, wherein each second path block of the second path blocks of the first and second DQ circuits comprises:
an input circuit configured to receive write data and adjust a timing to provide the write data and further configured to provide the write data; and
a write circuit configured to receive the write data and convert the write data in a serial format into the write data in a plurality of bits in parallel, and further configured to provide the write data in the plurality of bits to the memory cell array through a plurality of busses.

6. The apparatus of claim 4, wherein each second path block of the second path blocks of the first and second DQ circuits comprises:
a read circuit receive read data from a plurality of memory cells in the memory cell array a plurality of busses and further configured to convert the read data in a plurality of bits in parallel into the data in a serial format, and provide the read data in the serial format using an internal clock signal;
an output circuit including an output buffer configured to provide the read data in the seral format; and
a pre-output circuit coupled to the read circuit and further coupled to the output circuit, configured to adjust a slew rate of the output buffer based on a calibration signal.

7. The apparatus of claim 2, wherein the first DQ circuit comprises a first electrostatic discharge (ESD) protection circuit coupled to a corresponding first data pad, and configured to protect the first DQ circuit from failure due to electrostatic discharges from the first data pad,
wherein the second DQ circuit comprises a second ESD protection circuit coupled to a corresponding second data pad, and configured to protect the second DQ circuit from failure due to electrostatic discharges from the second data pad, and
wherein the first and the second ESD protection circuits are adjacent to each other.

8. The apparatus of claim 7, further comprising:
a first conductor configured to couple the first data pad to the first ESD protection circuit; and
a second conductor configured to cross over the second DQ circuit, and configured to couple the second data pad to the second ESD protection circuit,
wherein an impedance of the first conductor and an impedance of the second conductor are substantially the same.

9. The apparatus of claim 8, wherein the first and second ESD protection circuits and the first and second DQ circuits are disposed on a base layer, and
wherein the first and second conductors are included in one or more layers between the base layer and a layer in which the first and second data pads are disposed.

10. The apparatus of claim 8, wherein the first and second conductors are made of a distribution conductive layer.

11. An apparatus comprising:
a first data queue (DQ) circuit configured to receive first read data on a first bus and provide the first read data, and further configured to receive first write data and provide the first write data on the first bus; and
a first data pad configured to receive the first read data from the first DQ circuit, and further configured to receive the first write data and provide the first write data to the first DQ circuit;
a first power pad disposed across from the first data pad with respect to the first DQ circuit;
a second DQ circuit adjacent to the first DQ circuit, the second DQ circuit configured to receive second read data on a second bus and provide the second read data, and further configured to receive second write data and provide the second write data on the second data bus; and
a second data pad adjacent to the first power pad, the second data pad configured to receive the second read data from the second DQ circuit, and further configured to receive the second write data and provide the second write data to the second DQ circuit; and
a second power pad adjacent to the first data pad and disposed across from the second data pad with respect to the second DQ circuit.

12. The apparatus of claim 11, wherein each DQ circuit of the first DQ circuit and the second DQ circuit comprises a circuit, and
Wherein the circuits of the first and second circuit components are disposed in a symmetrical manner with respect to a border between the first and second DQ circuits.

13. The apparatus of claim 11, wherein the first power pad is configured to provide a first power supply to the first DQ circuit and the second power pad is configured to provide a second power supply to the first DQ circuit.

14. The apparatus of claim 11, further comprising:
a third DQ circuit adjacent to the first DQ circuit, configured to receive third read data on a third bus and provide the third read data, and further configured to receive third write data and provide the third write data on the third data bus; and
a third data pad adjacent to the first power pad, the third data pad configured to receive the third read data from the third DQ circuit, and further configured to receive the third write data and provide the third write data to the third DQ circuit,
wherein the second data pad, the power pad and the third data pad are aligned in a direction.

15. The apparatus of claim 14, wherein the second power pad, the first data pad and the third power pad are aligned in the direction.

16. The apparatus of claim 15, wherein the first data pad, the first DQ circuit and the first power pad are aligned in another direction perpendicular to the direction.

17. An apparatus comprising:
first and second data queue (DQ) circuits configured to receive read data from a memory cell array and provide the read data, and further configured to receive write data and provide the write data to the memory cell array;
first and second data pads, each data pad configured to receive the read data from a corresponding DQ circuit, and further configured to receive the write data and provide the write data to the corresponding DQ circuit;
first and second conductors, each conductor configured to couple a corresponding data pad to the corresponding DQ circuit;
a first power pad adjacent to the second data pad; and
a second power pad adjacent to the first data pad,
wherein the first data pad and the first power pad are disposed across from each other with respect to the first DQ circuit, and wherein the second data pad and the second power pad are disposed across from each other with respect to the second DQ circuit.

18. The apparatus of claim 17, further comprising:
a third power pad adjacent to the first data pad, wherein the second power pad and a third power pad are configured to provide different power supply voltages.

19. The apparatus of claim 17, wherein the first DQ circuit comprises a first ESD protection circuit coupled to the second data pad through the second conductor,
wherein the second DQ circuit comprises a second ESD protection circuit coupled to the second data pad through the second conductor,
wherein a first distance between the first data pad and the first ESD protection circuit and a second distance between the second data pad and the second ESD protection circuit are substantially the same.

20. The apparatus of claim 18, wherein the first DQ circuit comprises a first ESD protection circuit coupled to the second data pad through the second conductor,
wherein the second DQ circuit comprises a second ESD protection circuit coupled to the second data pad through the second conductor,
wherein a first impedance between the first data pad and the first ESD protection circuit and a second impedance between the second data pad and the second ESD protection circuit are substantially the same.

* * * * *